(12) United States Patent
Liao et al.

(10) Patent No.: US 6,936,408 B2
(45) Date of Patent: Aug. 30, 2005

(54) PARTIALLY PHOTOEXPOSED POSITIVE PHOTORESIST LAYER BLOCKING METHOD FOR REGIO-SELECTIVELY PROCESSING A MICROELECTRONIC LAYER

(75) Inventors: Yong-Shun Liao, Shanhua Jen (TW); Juing-Yi Wu, Chang Hua (TW); Dian-Hau Chen, Hsinchu (TW); Zhen-Cheng Chou, Taichung (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 142 days.

(21) Appl. No.: 10/197,322

(22) Filed: Jul. 16, 2002

(65) Prior Publication Data

US 2004/0013981 A1 Jan. 22, 2004

(51) Int. Cl.⁷ ............................. G03F 7/20; G03F 7/40
(52) U.S. Cl. ...................... 430/312; 430/317; 430/950; 438/253
(58) Field of Search .................. 430/312, 317, 430/950; 438/253

(56) References Cited

U.S. PATENT DOCUMENTS

| 6,218,090 B1 | 4/2001 | Minter et al. ............... 430/313 |
| 6,337,173 B2 | 1/2002 | Jen et al. .................... 430/394 |
| 6,365,452 B1 * | 4/2002 | Perng et al. ................ 438/241 |
| 6,602,749 B2 * | 8/2003 | Tu et al. ..................... 438/253 |
| 6,603,163 B2 * | 8/2003 | Hori et al. .................. 257/296 |

* cited by examiner

Primary Examiner—Yvette C. Thornton
(74) Attorney, Agent, or Firm—Tung & Associates

(57) ABSTRACT

Within a method for fabricating a microelectronic fabrication there is employed a patterned positive photoresist residue layer as a protective layer within an aperture when processing an upper region of a topographic microelectronic layer having formed therein the aperture. The patterned positive photoresist residue layer is formed employing an incomplete vertical, but complete horizontal, blanket photoexposure and development of a blanket positive photoresist layer formed upon the topographic microelectronic layer and filling the aperture. The method provides the microelectronic fabrication with enhanced reliability.

12 Claims, 1 Drawing Sheet

PARTIALLY PHOTOEXPOSED POSITIVE PHOTORESIST LAYER BLOCKING METHOD FOR REGIO-SELECTIVELY PROCESSING A MICROELECTRONIC LAYER

BACKGROUND OF THE INVENTION

1. Field of the Invention

The present invention relates generally to methods for fabricating microelectronic fabrications. More particularly, the present invention relates to methods for fabricating, with enhanced reliability, microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it often becomes difficult in the art of microelectronic fabrication to fabricate microelectronic fabrications with enhanced levels of reliability. Various factors influence microelectronic fabrication reliability, including but not limited to microelectronic fabrication design factors, microelectronic fabrication process integration factors and microelectronic fabrication materials selection factors. The foregoing factors are often interrelated are often not readily controlled.

It is thus desirable in the art of microelectronic fabrication to fabricate microelectronic fabrications with enhanced reliability.

It is towards the foregoing object that the present invention is directed.

Various methods have been disclosed in the art of microelectronic fabrication for fabricating microelectronic fabrications with desirable properties.

Included among the methods are methods directed towards novel photoresist layer processing which provide desirable properties within a microelectronic fabrication. Examples of such novel photoresist layer processing methods are disclosed within: (1) Minter et al., in U.S. Pat. No. 6,218,090; and (2) Jen et al., in U.S. Pat. No. 6,337,173, the disclosures of which are incorporated herein fully by reference.

Desirable in the art of microelectronic fabrication are additional methods which may be employed for fabricating microelectronic fabrications with enhanced reliability.

It is towards the foregoing object that the present invention is directed.

SUMMARY OF THE INVENTION

A first object of the present invention is to provide a method for fabricating a microelectronic fabrication.

A second object of the present invention is to provide a method in accord with the first object of the present invention, wherein the microelectronic fabrication is fabricated with enhanced reliability.

In accord with the objects of the present invention, there is provided by the present invention a method for fabricating a microelectronic fabrication.

To practice the method of the present invention, there is first provided a substrate. There is then formed over the substrate a topographic microelectronic layer comprising: (1) a lower region formed nearer the substrate; and (2) an upper region formed thereover. Within the present invention, the topographic microelectronic layer has formed therein an aperture. There is then deposited upon the topographic microelectronic layer and filling the aperture a blanket positive photoresist layer. There is then photoexposed partially the blanket positive photoresist layer to form a partially photoexposed blanket positive photoresist layer and developed the partially photoexposed blanket positive photoresist layer to leave remaining a positive photoresist residue layer within the aperture but not covering the upper region. There is then processed the upper region while employing the positive photoresist residue layer as a protective layer within the aperture. Finally, there is then stripped the positive photoresist residue layer from within the aperture.

The present invention provides a method for fabricating a microelectronic fabrication, wherein the microelectronic fabrication is fabricated with enhanced reliability.

The present invention realizes the foregoing object by employing within an aperture formed within a topographic microelectronic layer a positive photoresist residue layer, formed from a partially photoexposed and developed blanket positive photoresist layer, as protective layer while processing an upper region within the topographic microelectronic layer.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for fabricating a microelectronic fabrication, wherein the microelectronic fabrication is fabricated with enhanced reliability.

The present invention realizes the foregoing object by employing within an aperture formed within a topographic microelectronic layer a positive photoresist residue layer, formed from a partially photoexposed and developed blanket positive photoresist layer, as protective layer while processing an upper region within the topographic microelectronic layer.

Although the preferred embodiment of the present invention illustrates the present invention most particularly within the context of stripping a pair of patterned anti-reflective coating (ARC) layers from a microelectronic fabrication while preserving the integrity of a via defined by a pair of topographic composite dielectric layers from which is comprised the pair of patterned anti-reflective coating (ARC) layers, the present invention is not intended to be so limited.

Rather the present invention may be employed for preserving the integrity of apertures (and structures from which they are comprised) including but not limited to vias, trenches and other non-via apertures, within microelectronic fabrications including but not limited to integrated circuit microelectronic fabrications, ceramic substrate microelectronic fabrications and optoelectronic microelectronic fabrications. Similarly, the apertures (and structures from which they are comprised) in accord with the present invention whose integrity may be preserved, as well as microelectronic layers which may be processed while preserving the integrity of the apertures, may each be defined or formed of microelectronic materials including but not limited to microelectronic conductor materials, microelectronic semiconductor materials and microelectronic dielectric materials.

Referring now to FIG. 1 to FIG. 5, there is shown a series of schematic cross-sectional diagrams illustrating the results of progressive stages of fabricating, in accord with a preferred embodiment of the present invention, a microelectronic fabrication with enhanced reliability.

Figure 1:
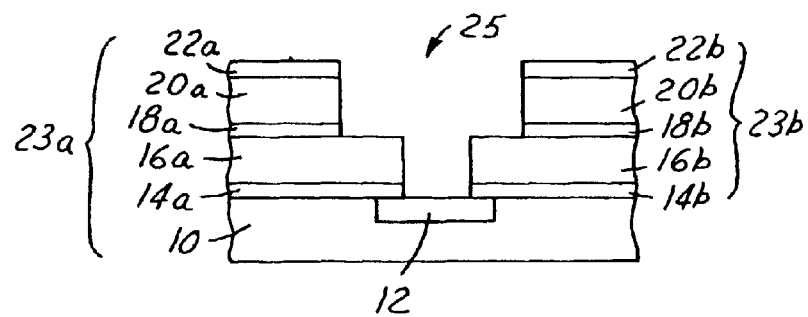
FIG. 1, FIG. 2, FIG. 3, FIG. 4 and FIG. 5 show a series of schematic cross-sectional diagrams illustrating the results of progressive stages of fabricating, in accord with a preferred embodiment of the present invention, a microelectronic fabrication with enhanced reliability.

Shown in FIG. 1 is a schematic cross-sectional diagram of the microelectronic fabrication at an early stage in its fabrication in accord with the preferred embodiment of the present invention.

Shown in FIG. 1, in a first instance, is a substrate 10 having formed therein a contact region 12.

Within the preferred embodiment of the present invention, the substrate 10 may be employed within a microelectronic fabrication selected from the group including but not limited to integrated circuit microelectronic fabrications, ceramic substrate microelectronic fabrications and optoelectronic microelectronic fabrications.

Although not specifically illustrated within the schematic cross-sectional diagram of FIG. 1, the substrate 10 may consist of a substrate alone as employed within the microelectronic fabrication, or in the alternative, the substrate 10 may comprise the substrate as employed within the microelectronic fabrication, wherein the substrate has formed thereupon and/or thereover additional microelectronic layers as are conventionally employed within the microelectronic fabrication within which is employed the substrate. Similarly with the substrate alone as employed within the microelectronic fabrication, such additional microelectronic layers may be formed from microelectronic materials selected from the group consisting of microelectronic conductor materials, microelectronic semiconductor materials and microelectronic dielectric materials.

Although also not specifically illustrated within the schematic cross-sectional diagram of FIG. 1, the substrate 10, typically and preferably, but not exclusively, when the substrate 10 consists of or comprises a semiconductor substrate as employed within a semiconductor integrated circuit microelectronic fabrication, has formed therein and/or thereupon microelectronic devices as are convention within the microelectronic fabrication within which is employed the substrate. Such microelectronic devices may be selected from the group including but not limited to resistors, transistors, diodes and capacitors.

Within the preferred embodiment of the present invention, the contact region 12 is typically and preferably either: (1) a semiconductor contact region, under circumstances where the substrate 10 consists of or comprises a semiconductor substrate; or (2) a conductor contact region under circumstances where the substrate 10 is employed within any of the foregoing microelectronic fabrications.

Also shown within the schematic cross-sectional diagram of FIG. 1, and formed upon or over the substrate 10 while leaving exposed a portion of the contact region 12, is a series of patterned layers comprising: (1) a pair of patterned first etch/stop barrier layers 14a and 14b formed upon exposed portions of the substrate 10 and bridging partially upon the contact region 12; (2) a pair of patterned first dielectric layers 16a and 16b formed aligned upon the pair of patterned first etch stop/barrier layers 14a and 14b; (3) a pair of patterned second etch stop layers 18a and 18b formed further spaced upon the pair of patterned first dielectric layers 16a and 16b; (4) a pair of patterned second dielectric layers 20a and 20b formed aligned upon the pair of patterned second etch stop layers 18a and 18b; and (5) a pair of patterned anti-reflective coating (ARC) layers 22a and 22b formed aligned upon the pair of patterned second dielectric layers 20a and 20b.

Within the preferred embodiment of the present invention, the pair of patterned first etch stop/barrier layers 14a and 14b and the pair of patterned second etch stop layers 18a and 18b may be formed of etch stop/barrier materials as are otherwise conventional or unconventional in the art of microelectronic fabrication, including but not limited to silicon carbide etch stop/barrier materials, silicon nitride etch stop/barrier materials and silicon carbonitride etch stop/barrier materials.

Within the preferred embodiment of the present invention, each of the pair of patterned first dielectric layers 16a and 16b and the pair of patterned second dielectric layers 20a and 20b may also be formed employing methods and materials as are conventional or unconventional in the art of microelectronic fabrication, including but not limited to generally higher dielectric constant dielectric materials, such as but not limited to silicon oxide dielectric materials and variants thereof) and generally lower dielectric constant dielectric materials, such as but not limited to organic polymer spin-on-polymer (SOP) dielectric materials, spin-on-glass (SOG) dielectric materials, amorphous carbon dielectric materials and fluorosilicate glass (FSG) dielectric materials). Typically and preferably, each of the pair of patterned first dielectric layers 16a and 16b and the pair of patterned second dielectric layers 20a and 20b are formed of a fluorosilicate glass (FSG) dielectric material.

Finally, within the preferred embodiment of the present invention the pair of patterned anti-reflective coating (ARC) layers 22a and 22b is typically and preferably formed of a silicon oxynitride anti-reflective coating (ARC) material, although other anti-reflective coating (ARC) materials and thicknesses may also be employed.

As is understood buy a person skilled in the art, within the microelectronic fabrication whose schematic cross-sectional diagram is illustrated in FIG. 1, the series of patterned layers comprising: (1) the pair of patterned first etch stop/barrier layers 14a and 14b; (2) the pair of patterned first dielectric layers 16a and 16b; (3) the pair of patterned second etch stop layers 18a and 18b; (4) the pair of patterned second dielectric layers 20a and 20b; and (5) the pair of patterned anti-reflective coating (ARC) layers 22a and 22b, comprises in an aggregate a pair of patterned topographic composite dielectric layers 23a and 23b defining an aperture 25 which comprises: (1) a via defined by the pair of patterned first etch stop/barrier layers 14a and 14b and the pair of patterned first dielectric layers 16a and 16b, the via in turn being overlapped by; (2) a trench of greater areal dimensions than the via, the trench being defined by the pair of patterned second etch stop layers 18a and 18b, the pair of patterned second dielectric layers 20a and 20b and the pair of patterned anti-reflective coating (ARC) layers 22a and 22b.

As is further understood by a person skilled in the art, within the microelectronic fabrication whose schematic cross-sectional diagram is illustrated in FIG. 1, it is often desirable to strip from the pair of patterned second dielectric layers 20a and 20b the pair of patterned anti-reflective coating (ARC) layers 22a and 22b, while in turn preserving the integrity of the contact region 12 within the aperture 25 (which is also recognized by a person skilled in the art as a dual damascene aperture), such that the microelectronic fabrication whose schematic cross-sectional diagram is illustrated in FIG. 1 may be further fabricated with enhanced performance (by removing the pair of patterned anti-reflective coating (ARC) layers formed of the generally higher dielectric constant silicon oxynitride dielectric material) and enhanced reliability (by preserving the integrity of the contact region 12).

The preferred embodiment of the present invention is directed specifically towards the foregoing goals.

Figure 2:
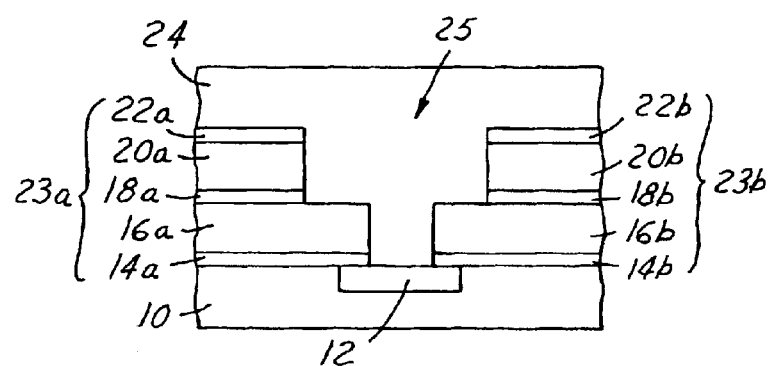

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein there is formed upon the pair of patterned topographic composite dielectric layers 23a and 23b and filling the aperture 25 a blanket positive photoresist layer 24.

Within the preferred embodiment of the present invention, the blanket positive photoresist layer 24 may be formed of positive photoresist materials as are conventional in the art of microelectronic fabrication. Typically and preferably, the blanket positive photoresist layer is formed filling the aperture 25, upon the pair of patterned anti-reflective coating (ARC) layers 22a and 22b.

Figure 3:
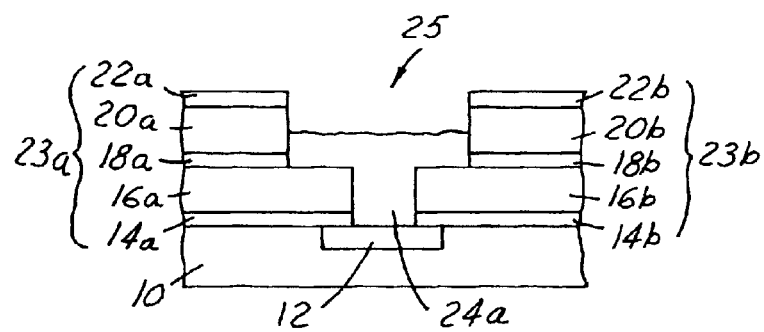

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein the blanket positive photoresist layer 24 has been partially vertically photoexposed and developed to leave a patterned positive photoresist residue layer 24a within the aperture but no positive photoresist layer or positive photoresist residue layer upon the pair of patterned anti-reflective coating (ARC) layers 22a and 22b, which within the contest of the present invention comprise a pair of upper sub-layers or upper regions within the pair of patterned topographic composite dielectric layers 23a and 23b.

Within the preferred embodiment of the present invention, the patterned positive photoresist residue layer 24a is formed from the blanket positive photoresist layer 24 incident to a horizontally complete blanket photoexposure of the blanket positive photoresist layer 24 but a vertically incomplete photoexposure of the blanket positive photoresist layer 24. The vertically incomplete photoexposure is effected by selecting a photoexposure dose which completely penetrates the blanket positive photoresist layer 24 at locations other than those within the aperture, but does not completely penetrate the blanket positive photoresist layer 24 at the location within the aperture. Such a photoexposure dose is readily determined employing methods as are conventional in the art.

While the schematic cross-sectional diagram of FIG. 3 illustrates the patterned positive photoresist residue layer 24a as reaching upward into trench portion of the aperture 25, a patterned positive photoresist residue layer, such as the patterned positive photoresist residue layer 24a, may be of more limited height and be contained only within the via portion of the aperture 25.

Figure 4:
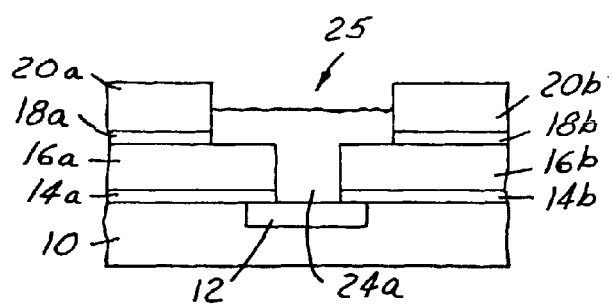

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein the pair of patterned anti-reflective coating layers 22a and 22b has been stripped from the pair of patterned second dielectric layers 20a and 20b.

Within the preferred embodiment of the present invention, the pair of patterned anti-reflective coating (ARC) layers 22a and 22b may be stripped employing methods and materials as are otherwise generally conventional in the art of microelectronic fabrication, including dry plasma etch methods, and more preferably wet chemical etch methods.

Figure 5:
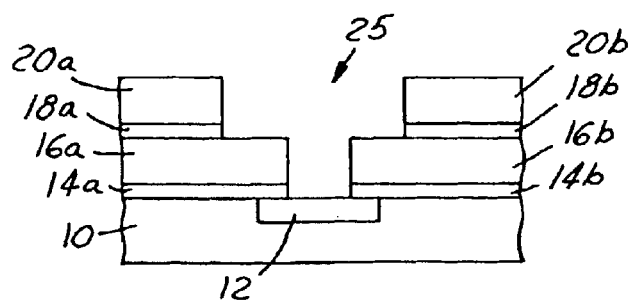

While the schematic cross-sectional diagram of FIG. 5 illustrates the complete stripping of the pair of patterned anti-reflective coating (ARC) layers 22a and 22b while protecting the contact region 12 with the patterned positive photoresist residue layer 24a, within a more general context of the present invention, a pair of upper sub-layers (or upper regions) within a pair of topographic composite microelectronic layers (or topographic non-composite microelectronic layers) need only be further processed such as to also provide value within the context of the present invention. Such further processing may include, but is not limited to additive processing (i.e., deposition processing), modification processing (i.e., generally recognized as neither additive processing of subtractive processing, such as plasma treatment processing) and subtractive processing (i.e., etch processing).

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein the patterned positive photoresist residue layer 24a has been stripped from within the aperture 25.

Within the preferred embodiment of the present invention, the patterned positive photoresist residue layer 24a may be stripped employing methods as are conventional in the art of microelectronic fabrication, including but not limited to photoexposure and development stripping methods and direct stripper photoresist stripping methods.

Upon forming the microelectronic fabrication whose schematic cross-sectional diagram is illustrated in FIG. 5, there is formed a microelectronic fabrication in accord with the preferred embodiment of the method of the present invention. The microelectronic fabrication is formed with enhanced reliability insofar as a contact region within an aperture is protected with a patterned positive photoresist residue layer formed incident to a blanket horizontal but incomplete vertical photoexposure and development of a blanket positive photoresist layer.

As is understood by a person skilled in the art, the microelectronic fabrication whose schematic cross-sectional diagram is illustrated in FIG. 5 will typically have formed within the aperture 25 a contiguous patterned conductor interconnect and patterned conductor stud layer (formed employing a damascene method) which is also formed with enhanced reliability insofar as contact thereof with the contact region 12 is enhanced.

As is further understood by a person skilled in the art, the preferred embodiment of the present invention is illustrative of the present invention rather than limiting of the present invention. Revisions and modification may be made to methods materials, structure and dimensions employed within the context of the preferred embodiment of the present invention while still providing a method in accord with the present invention, further in accord with the accompanying claims.

What is claimed is:

1. A method for fabricating a microelectronic fabrication comprising:

providing a substrate;

forming over the substrate a topographic microelectronic layer comprising:

a lower region formed nearer the substrate; and
an upper region formed thereover, the topographic microelectronic layer having formed therein an aperture;
depositing upon the topographic microelectronic layer and filling the aperture a blanket positive photoresist layer;
photoexposing horizontally completely and vertically partially the blanket positive photoresist layer to form a partially photoexposed blanket positive photoresist layer and developing the partially photoexposed blanket positive photoresist layer to leave remaining a positive photoresist residue layer within the aperture but not covering the upper region;
processing the upper region while employing a method selected from the group consisting of additive processing methods and modification processing methods, and while employing the positive photoresist residue layer as a protective layer within the aperture; and
stripping the positive photoresist residue layer from within the aperture.

2. The method of claim 1 wherein the substrate is employed within a microelectronic fabrication selected from the group consisting of integrated circuit microelectronic fabrications, ceramic substrate microelectronic fabrications and optoelectronic microelectronic fabrications.

3. The method of claim 1 wherein the topographic microelectronic layer is formed from a microelectronic material selected from the group consisting of microelectronic conductor materials, microelectronic semiconductor materials and microelectronic dielectric materials.

4. The method of claim 1 wherein the aperture is selected from the group consisting of vias, trenches and other non-via apertures.

5. A method for fabricating a microelectronic fabrication comprising:
providing a substrate;
forming over the substrate a topographic composite microelectronic layer comprising:
a lower sub-layer formed nearer the substrate; and
an upper sub-layer formed thereover, and formed as an anti-reflective coating (ARC) layer, the topographic composite microelectronic layer having formed therein an aperture;
depositing upon the topographic composite microelectronic layer and filling the aperture a blanket positive photoresist layer;
photoexposing horizontally completely and vertically partially the blanket positive photoresist layer to form a partially photoexposed blanket positive photoresist layer and developing the partially photoexposed blanket positive photoresist layer to leave remaining a positive photoresist residue layer within the aperture but not covering the upper sub-layer;
processing the upper sub-layer while employing the positive photoresist residue layer as a protective layer within the aperture; and
stripping the positive photoresist residue layer from within the aperture.

6. The method of claim 5 wherein the substrate is employed within a microelectronic fabrication selected from the group consisting of integrated circuit microelectronic fabrications, ceramic substrate microelectronic fabrications and optoelectronic microelectronic fabrications.

7. The method of claim 5 wherein the lower sub-layer is formed from a microelectronic material selected from the group consisting of microelectronic conductor materials, microelectronic semiconductor materials and microelectronic dielectric materials.

8. The method of claim 5 wherein the aperture is selected from the group consisting of vias, trenches and other non-via apertures.

9. The method of claim 5 wherein the upper sub-layer is processed employing a method selected from the group consisting of additive processing methods, modification processing methods and subtractive processing methods.

10. The method of claim 5 wherein
the anti-reflective coating (ARC) layer is formed of a silicon oxynitride anti-reflective coating material.

11. A method for fabricating a microelectronic fabrication comprising:
providing a substrate;
forming over the substrate a topographic microelectronic layer comprising:
a lower region formed nearer the substrate; and
an upper region formed thereover, the topographic microelectronic layer having formed therein an aperture which is a dual damascene aperture;
depositing upon the topographic microelectronic layer and filling the aperture a blanket positive photoresist layer;
photoexposing horizontally completely and vertically partially the blanket positive photoresist layer to form a partially photoexposed blanket positive photoresist layer and developing the partially photoexposed blanket positive photoresist layer to leave remaining a positive photoresist residue layer within the aperture but not covering the upper region;
processing the upper region while employing the positive photoresist residue layer as a protective layer within the aperture; and stripping the positive photoresist residue layer from within the aperture.

12. A method for fabricating a microelectronic fabrication comprising:
providing a substrate;
forming over the substrate a topographic composite microelectronic layer comprising:
a lower sub-layer formed nearer the substrate; and
an upper sub-layer formed thereover, the topographic composite microelectronic layer having formed therein an aperture which is a dual damascene aperture;
depositing upon the topographic composite microelectronic layer and filling the aperture a blanket positive photoresist layer;
photoexposing horizontally completely and vertically partially the blanket positive photoresist layer to form a partially photoexposed blanket positive photoresist layer and developing the partially photoexposed blanket positive photoresist layer to leave remaining a positive photoresist residue layer within the aperture but not covering the upper sub-layer;
processing the upper sub-layer while employing the positive photoresist residue layer as a protective layer within the aperture; and
stripping the positive photoresist residue layer from within the aperture.

* * * * *